United States Patent
Coyle et al.

(10) Patent No.: US 7,026,710 B2
(45) Date of Patent: Apr. 11, 2006

(54) MOLDED PACKAGE FOR MICROMECHANICAL DEVICES AND METHOD OF FABRICATION

(75) Inventors: Anthony L. Coyle, Plano, TX (US); George A. Bednarz, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/760,517

(22) Filed: Jan. 10, 2001

(65) Prior Publication Data

US 2006/0006523 A1   Jan. 12, 2006

Related U.S. Application Data (60) Provisional application No. 60/177,446, filed on Jan. 21, 2000.

(51) Int. Cl.
  *H01L 23/12* (2006.01)
(52) U.S. Cl. .................... 257/704; 257/787
(58) Field of Classification Search ............ 257/81, 257/82, 99, 433, 434, 660, 678, 787–796, 257/414–418, 710, 704, 780; 361/679; 438/106–127
See application file for complete search history.

(56) References Cited

U.S. PATENT DOCUMENTS

| | | | |
|---|---|---|---|
| 5,061,049 A | | 10/1991 | Hornbeck |
| 5,096,279 A | | 3/1992 | Hornbeck et al. |
| 5,098,626 A | * | 3/1992 | Pas .......................... 264/151 |
| 5,151,276 A | | 9/1992 | Sato et al. |
| 5,280,139 A | * | 1/1994 | Suppelsa et al. ............ 174/260 |
| 5,293,511 A | * | 3/1994 | Poradish et al. ............ 257/434 |
| 5,331,454 A | | 7/1994 | Hornbeck |
| 5,455,456 A | * | 10/1995 | Newman .................... 257/704 |
| 5,650,915 A | * | 7/1997 | Alfaro et al. ............... 361/707 |
| 5,684,327 A | * | 11/1997 | Nakazawa et al. .......... 257/667 |

(Continued)

FOREIGN PATENT DOCUMENTS

EP    0250146    *   9/1987

(Continued)

OTHER PUBLICATIONS

Peter Van Zant, Microchip Fabrication, 2000, McGraw-Hill, pp. 578 and 579.*

*Primary Examiner*—Amir Zarabian
*Assistant Examiner*—Monica Lewis
(74) *Attorney, Agent, or Firm*—Yingsheng Tung; Wade James Brady, III; Frederick J. Telecky, Jr.

(57) ABSTRACT

According to the present invention, a plastic land-grid array package, a plastic ball-grid package, and a plastic leaded package for micromechanical components are fabricated by a molding process characterized by placing a sheet-like protector on the surface of the components during the molding phase, selectively encapsulating the bonding pads and coupling members of the chip while leaving empty space above the components, removing the protector and attaching a lid over the components. A molding method as well as a molding apparatus are provided compatible with the sensitivity of the micromechanical devices, yet flexible with regard to the technique used to assemble the chip and the substrate. Furthermore, the method disclosed is flexible with regard to the material and the properties of the substrate. The invention is applicable to a variety of different semiconductor micromechanical devices, for instance actuators, motors, sensors, spatial light modulators, and deformable mirror devices. In a key embodiment of the invention, the micromechanical components are micromirrors for a digital mirror device.

9 Claims, 3 Drawing Sheets

U.S. PATENT DOCUMENTS

| | | | |
|---|---|---|---|
| 5,729,050 A * | 3/1998 | Kim | 257/667 |
| 5,897,338 A | 4/1999 | Kaldenberg | |
| 5,904,497 A * | 5/1999 | Akram | 438/106 |
| 5,917,235 A * | 6/1999 | Imura | 257/669 |
| 5,936,758 A | 8/1999 | Fisher et al. | |
| 5,939,778 A * | 8/1999 | Boutin et al. | 257/678 |
| 5,939,785 A * | 8/1999 | Klonis et al. | 257/729 |
| 5,955,115 A * | 9/1999 | Bolanos et al. | 425/116 |
| 6,265,766 B1 * | 7/2001 | Moden | 257/678 |
| 6,274,927 B1 * | 8/2001 | Glenn | 257/680 |
| 6,291,884 B1 * | 9/2001 | Glenn et al. | 257/747 |
| 6,309,916 B1 * | 10/2001 | Crowley et al. | 438/127 |
| 6,429,530 B1 * | 8/2002 | Chen | 257/778 |
| 6,441,481 B1 * | 8/2002 | Karpman | 257/711 |
| 6,445,077 B1 * | 9/2002 | Choi et al. | 257/786 |
| 6,489,178 B1 * | 12/2002 | Coyle et al. | 438/51 |
| 6,528,868 B1 * | 3/2003 | Weiblen et al. | 257/669 |
| 6,531,334 B1 * | 3/2003 | Sasano | 438/64 |
| 2001/0020743 A1 * | 9/2001 | Eldridge et al. | 257/737 |
| 2002/0025607 A1 * | 2/2002 | Danno et al. | 438/126 |
| 2003/0042625 A1 * | 3/2003 | Kurosawa et al. | 257/787 |
| 2003/0045025 A1 * | 3/2003 | Coyle et al. | 438/106 |
| 2003/0193086 A1 * | 10/2003 | Adachi et al. | 257/710 |

FOREIGN PATENT DOCUMENTS

| | | | |
|---|---|---|---|
| JP | 354152970 | * | 12/1979 |
| JP | 403020350 A | * | 1/1991 |

* cited by examiner

MOLDED PACKAGE FOR MICROMECHANICAL DEVICES AND METHOD OF FABRICATION

This application claims priority under 35 USC § 119 based upon Provisional Patent Application No. 60/177,446 filed Jan. 21, 2000.

FIELD OF THE INVENTION

The present invention is related in general to the field of semiconductor devices and processes and more specifically to the design and fabrication of a molded package generally for micromechanical devices and specifically for digital mirror devices.

DESCRIPTION OF THE RELATED ART

Micromechanical devices include actuators, motors, sensors, spatial light modulators (SLM), digital micromirror devices or deformable mirror devices (DMD), and others. The technical potential of these devices is especially evident when the devices are integrated with semiconductor circuitry using the miniaturization capability of semiconductor technology.

SLMs are transducers that modulate incident light in a special pattern pursuant to an electrical or other input. The incident light may be modulated in phase, intensity, polarization or direction. SLMs of the deformable mirror class include micromechanical arrays of electronically addressable mirror elements or pixels, which are selectively movable or deformable. Each mirror element is movable in response to an electrical input to an integrated addressing circuit formed monolithically with the addressable mirror elements in a common substrate. Incident light is modulated in direction and/or phase by reflection from each element.

As set forth in greater detail in commonly assigned U.S. Pat. No. 5,061,049, issued on Oct. 29, 1991 (Hornbeck, "Spatial Light Modulator and Method"), deformable mirror SLMs are often referred to as DMDs in three general categories: elastomeric, membrane, and beam. The latter category includes torsion beam DMDs, cantilever beam DMDs, and flexure beam DMDs. Each movable mirror element of all three types of beam DMD includes a relatively thick metal reflector supported in a normal, undeflected position by an integral, relatively thin metal beam. In the normal position, the reflector is spaced from a substrate-supported, underlying control electrode, which may have a voltage selectively impressed thereon by the addressing circuit.

When the control electrode carries an appropriate voltage, the reflector is electrostatically attracted thereto and moves or is deflected out of the normal position toward the control electrode and the substrate. Such movement or deflection of the reflector causes deformation of its supporting beam storing therein potential energy which tends to return the reflector to its normal position when the control electrode is de-energized. The deformation of a cantilever beam comprises bending about an axis normal to the beam's axis. The deformation of a torsion beam comprises deformation by twisting about an axis parallel to the beam's axis. The deformation of a flexure beam, which is a relatively long cantilever beam connected to the reflector by a relatively short torsion beam, comprises both types of deformation, permitting the reflector to move in piston-like fashion.

A typical DMD includes an array of numerous pixels, the reflectors of each of which are selectively positioned to reflect or not to reflect light to a desired site. In order to avoid an accidental engagement of a reflector and its control electrode, a landing electrode may be added for each reflector. It has been found, though, that a deflected reflector will sometimes stick or adhere to its landing electrode. It has been postulated that such sticking is caused by intermolecular attraction between the reflector and the landing electrode or by high surface energy substances adsorbed on the surface of the landing electrode and/or on the portion of the reflector which contacts the landing electrode. Substances which may impart such high surface energy to the reflector-landing electrode interface include water vapor or other ambient gases (e.g., carbon monoxide, carbon dioxide, oxygen, nitrogen) and gases and organic components resulting from or left behind following production of the DMD. A suitable DMD package is disclosed in commonly assigned U.S. Pat. No. 5,293,511 issued on Mar. 8, 1994 (Poradish et al., "Package for a Semiconductor Device").

Sticking of the reflector to the landing electrode has been overcome by applying selected numbers, durations, shapes and magnitudes of voltage pulses to the control electrode. Detail can be found in U.S. Pat. No. 5,096,279, issued on Mar. 17, 1992 (Hornbeck et al., "Spatial Light Modulator and Method"). Further improvement of the sticking problem is disclosed in commonly assigned U.S. Pat. No. 5,331,454, issued on Jul. 19, 1994 (Hornbeck, "Low Reset Voltage Process for DMD"). This patent describes a technique for passivating or lubricating the portion of the landing electrode engaged by the deformed reflector, and/or the portion of the deformed reflector which engages the landing electrode. Passivation is effected by lowering the surface energy of the landing electrode and/or the reflector, which is, in turn, effected by chemically vapor-depositing on the engageable surfaces a monolayer of a long-chain aliphatic halogenated polar compound, such as perfluoroalkyl acid. Objects do not easily, if at all, stick or adhere to low energy surfaces, which are also usually expected to be resistant to sorption thereonto of high surface-energy imparting substances such as water vapor.

Refinements of the passivation method are disclosed in U.S. Pat. No. 5,939,785, issued on Aug. 17, 1999 (Klonis et al., "Micromechanical Device including Time-release Passivant"), and U.S. Pat. No. 5,936,758, issued on Aug. 10, 1999 (Fisher et al., "Method of Passivating a Micromechanical Device within a Hermetic Package"). The method an enclosed source time-releasing a passivant, preferably a molecular sieve or binder impregnated with the passivant. Further, the method is placing a predetermined quantity of the passivant in the package just after device activation, and is then immediately welding a hermetic lid (free of passivant during the welding process) to the package.

Today's overall package structure for micromechnical devices and method of fabrication is expensive. This fact is in conflict with the market requirements for many applications of micromechanical devices, which put a premium at low device cost and, therefore, low package cost. An urgent need has therefore arisen for a coherent, low-cost method of encapsulating micromechanical chips and for a low cost reliable package structure. The method should be flexible enough to be applied for different micromechanical product families and a wide spectrum of design and process variations. Preferably, these innovations should be accomplished while shortening production cycle time and increasing throughput.

SUMMARY OF THE INVENTION

According to the present invention, a plastic land-grid array package, a plastic ball-grid package, and a plastic leaded package for micromechanical components are fabricated by a molding process characterized by placing a sheet-like protector on the surface of the components during the molding phase, selectively encapsulating the bonding pads and coupling members of the chip while leaving empty space above the components, removing the protector and attaching a lid over the components. A molding method as well as a molding apparatus are provided compatible with the sensitivity of the micromechanical devices, yet flexible with regard to the technique used to assemble the chip and the substrate. Furthermore, the method disclosed is flexible with regard to the material and the properties of the substrate.

It is an aspect of the present invention to be applicable to a variety of different semiconductor micromechanical devices, for instance actuators, motors, sensors, spatial light modulators, and deformable mirror devices. In all applications, the invention achieves technical advantages as well as significant cost reduction and yield increase.

In a key embodiment of the invention, the micromechanical components are micromirrors for a digital mirror device. In this case, the lid is a plate made of glass or any other material transparent to light, and the protector sheet is selected from a group of water-soluble polymers.

It is another aspect of the present invention to modify the transfer molding technique so that it becomes applicable to encapsulating micromechanical devices and concurrently protects the micromechnical components during the total process (for example against dust and released chemicals), resulting in significantly higher manufacturing yield and enhanced device quality and reliability.

Another aspect of the invention is to completely embed all sensitive interconnection means (such as bonding wires, ribbons, or solder) in the molded material.

Another aspect of the invention is be applicable to a wide variety of substrates, made either of stiff or of flexible material, such as polymer-based boards or plastic films having multi-level metallization.

Another aspect of the invention is to provide the technology needed for mass-fabricating micromechanical devices in chip-scale or even chip-size packages—a necessity for many product applications in miniaturized configurations.

Another aspect of the invention is to be applicable to batch processing, including mold chases with multiple cavities, and to easy methods for singulating, trimming and forming the devices.

Another aspect of the invention is to provide flexibility of the package structure relative to the geometry (contour and area) of the semiconductor chip containing the plurality of micromechanical components.

Another aspect of the invention is to employ the precision machining capabilities of today's mold chase manufacturers in order to obtain the flatness of the molded parts, enabling a lid (for example, glass plate) attachment in a plane parallel to the plane of the plurality of micromechanical components.

These aspects have been achieved by the teachings of the invention concerning structure, methods and apparatus suitable for mass production. Various modifications have been employed for the assembly of the semiconductor chips, the design and material of the substrates, and the method of fabrication.

In the first embodiment of the invention, the coupling members connecting the chip bonding pads to the substrate routing line are made of bonding wires or ribbons.

In the second embodiment of the invention, the coupling members connecting the chip bonding pads to the substrate routing lines are made of solder, supplied generally in shapes of balls or bumps.

In the third embodiment of the invention, the substrate is a flexible plastic film having multi-level metal interconnections. The substrate further has terminals for attaching solder balls as means for connecting to external parts.

In the fourth embodiment of the invention, the substrate is a metallic leadframe, which has its external leads trimmed and formed at the end of the assembly and packaging process in order to comply with customer specifications.

The technical advances represented by the invention, as well as the aspects thereof, will become apparent from the following description of the preferred embodiments of the invention, when considered in conjunction with the accompanying drawings and the novel features set forth in the appended claims.

BRIEF DESCRIPTION OF THE DRAWINGS

FIGS. 1 to 9 are schematic and simplified cross sections illustrating the assembly and packaging process flow for the molded micromechanical device of the invention.

FIGS. 1A to 9A illustrate the assembly and packaging process flow for the first embodiment of the invention combined with the third embodiment.

FIGS. 1B to 9B illustrate the assembly and packaging process flow for the second embodiment of the invention combined with the fourth embodiment.

FIGS. 1A and 1B depict semiconductor chips having a plurality of micromechanical components in the central area.

FIGS. 2A and 2B illustrate the step of covering the plurality of micromechanical components with a protective means.

FIG. 3A illustrates the step of attaching the chip to the substrate.

FIG. 3B illustrates the step of attaching solder balls as coupling members to the chip bonding pads.

FIG. 4A illustrates the step of connecting the chip bonding pads to the substrate routing lines using bonding wires as coupling members.

FIG. 4B illustrates the step of connecting the inner leads of a leadframe to the solder balls on the chip.

FIGS. 5A and 5B illustrate the step of molding encapsulation material in the peripheral areas of the chips.

FIGS. 6A and 6B illustrate the step of removing the protective means from the surface of the micromechanical components.

FIGS. 7A and 7B illustrate the step of depositing chemical compounds onto molded ridge-like protrusions.

FIGS. 8A and 8B illustrate the step of attaching a lid onto flat surfaces of the molded frame.

FIGS. 9A and 9B illustrate the finished molded package for micromechanical devices according to the structure and method of the invention.

FIG. 9A illustrates the step of attaching solder balls to the terminals of the substrate.

FIG. 9B illustrates the step of trimming and forming the outer leads of the leadframe of the device.

DETAILD DESCRIPTION OF THE PREFERRED EMBODIMENTS

Figure 1A:
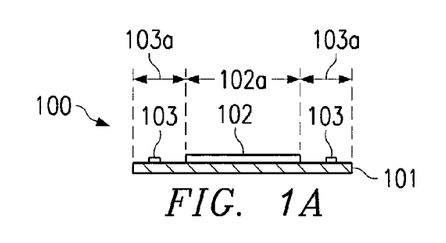
Figure 1B:
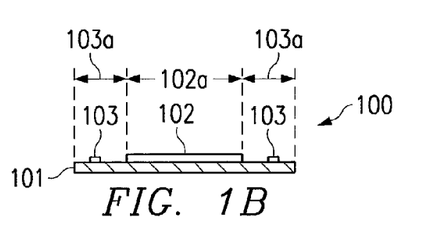

In FIGS. 1A and 1B, a semiconductor chip of the micromechanical type is shown, generally designate 100. Chip 100 is formed on and in a single-crystalline material 101, typically silicon; it includes an integrated circuit (not shown) and a plurality of micromechanical components 102 in the central area 102a of the chip. The micromechanical components are disposed in a plane. Further, chip 100 includes a plurality of bonding pads 103 as input/output terminals of the integrated circuit and the micromechanical components. The bonding pads are disposed in the peripheral areas 103a of the chip.

As mentioned above, the micromechanical components 102 may include actuators, motors, sensors, spatial light modulators, and deformable mirror devices. By way of example and purposes of illustration, micromechanical components 102 are digital micromirror devices (DMD), as manufactured by Texas Instruments Incorporated of Dallas, Tex., U.S.A.

Structures and methods of micromechanical devices according to the invention are illustrated by way of example in two process flows and mold configurations. Process flow A is depicted in FIGS. 1A to 9A. It combines the first embodiment of the invention, namely the use of bonding wires or ribbons, and the third embodiment of the invention, namely the use of an electrically insulating substrate with integral conductive routing lines. Process flow B is depicted in FIGS. 1B to 9B. It combines the second embodiment of the invention, namely the use of solder, and the fourth embodiment of the invention, namely the use of a leadframe.

Process Flows A and B. Step 1: Singulating Chip.

In well-known fashion, a plurality of chips 100 has been fabricated in a whole semiconductor wafer. As the final step of the wafer fabrication process, the chips are singulated, commonly by sawing.

Process Flows A and B. Step 2: Covering Central Area containing Plurality of Components with Protective Means.

Figure 2A:
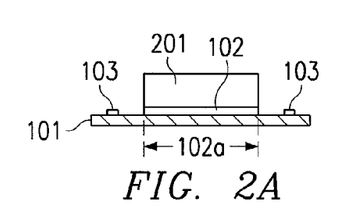
Figure 2B:
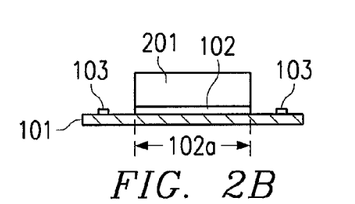

As FIGS. 2A and 2B show, it is an important feature of the present invention to protect the surfaces of the micromechanical components during the assembly and packaging process steps. In the preferred process, a sheet-like polymer material 201 covers the central chip area 102a. This material is preformed to the geometrical configuration and at least the size of the central area 102a. Preferably, the polymer material is water-soluble and is selected from a group consisting of polyethylene oxide, polyvinyl alcohol, polyoxyethylene, cellulose methyl ether, hydroxyethyl cellulose, carboxymethyl cellulose, poly vinyl pyrrolidone, polyacrylic acid, and acrylic acid copolymers.

Process Flow A. Step 3: Forming Substrate.

Figure 3A:
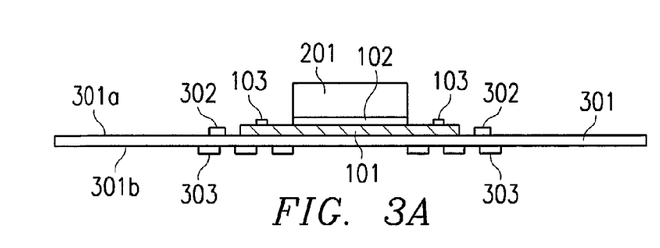

In FIG. 3A, an electrically insulating substrate 301 is shown with a first surface 301a and a second surface 301b. The substrate is formed so that it has a plurality of conductive routing lines integral with the substrate and patterned from multilevel metal layers embedded in the substrate (not shown in FIG. 3A). Further, the substrate has a first plurality of terminals 302 on the first surface, intended for wire bond connections, and a second plurality of terminals 303 on the second surface, intended for solder connection to the "outside world". The terminals are electrically connected with the routing lines, respectively.

The insulating substrate is selected from a group consisting of flexible films made of polymers, polyimides or epoxies, and sheet-like boards made of FR-4, FR-5, BT resin, or glass-fiber strengthened dielectrics. Insulating substrates are commercially available, for instance Novaclad® and ViaGrid® from Sheldahl, Inc., Northfield, Minn. They are typically fabricated by laminating alternative films of electrically insulating and electrically conducting materials into one coherent layer. Connections through individual insulating films are made by laser drilling and metal refilling or plating, and patterning of the conductive films is achieved by ablating or etching. There are numerous designs and variations of insulating substrates available.

Process Flow A. Step 4: Attaching Chip to Substrate.

As FIG. 3A indicates, chip 101 together with protective means 201 is attached to the first surface 301a of substrate 301. Typically, an epoxy adhesive is used for attaching; however, a polyimide adhesive may also be useful.

Process Flow B. Step 3: Attaching Solder Balls to Chip Bonding Pads.

Figure 3B:
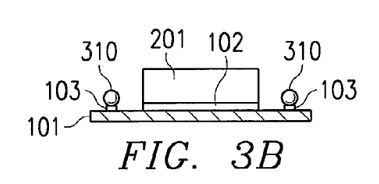

In the second embodiment of the present invention, solder balls 310 are attached to the bonding pads 103 of chip 101; see FIG. 3B. The solder will connect to the substrate routing lines.

As used herein, the term solder "ball" does not imply that the solder contacts are necessarily spherical; they may have various forms, such as semispherical, half-dome, truncated cone, or generally bump, or a cylinder with straight, concave or convex outlines. The exact shape is a function of the deposition technique (such as evaporation, plating, or prefabricated units) and reflow technique (such as infrared or radiant heat), and the material composition. Generally, a mixture of lead and tin is used; other materials include indium, alloys of tin/indium, tin silver, tin/bismuth, or conductive adhesive compounds. The melting temperature of the solder balls used for chip 110 may be different from the melting temperature of the solder balls used for the other chip, or the solder balls used for connecting the module to the outside world. Several methods are available to achieve consistency of geometrical shape by controlling amount of material and uniformity of reflow temperature. Typically, the diameter of the solder balls ranges from 0.1 to 0.5 mm, but can be significantly larger.

Process Flow A. Step 5: Wire Bonding.

Figure 4A:
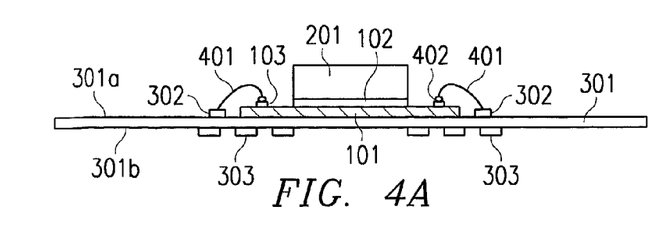

In FIG. 4A, wire ball bonding is employed to connect the chip bonding pads 103 to the terminals 302 on the first surface 301a of substrate 301. The wire bonding process begins by positioning both chip and substrate on a heated pedestal to raise their temperature to between 170 and 300° C. A wire 401 typically of gold, gold-berryllium alloy, other gold alloy, or copper, having a diameter typically ranging from 18 to 33 μm, is strung through a heated capillary where the temperature usually ranges between 200 and 500° C. At the tip of the wire, a free air ball is created using either a flame or a spark technique. The ball has a typical diameter from about 1.2 to 1.6 wire diameters. The capillary is moved towards the chip bonding pad 402 and the ball is pressed against the metallization of the bonding pad (typically aluminum, aluminum-copper alloy, or copper). For pads of aluminum, a combination of compression force and ultrasonic energy creates the formation of gold-aluminum intermetallics and thus a strong metallurgical bond. At time of bonding, the temperature usually ranges from 150 to 270° C.

In the case of copper wire on copper pad, only metal interdiffusion takes places in order to generate the strong weld.

Alternatively, wedge bonding can be used to attach the wire to the bonding pad. This technique is favored when bonding ribbon is used instead of wire.

It is important for the present invention that recent technical advances in wire bonding now allow the formation of small yet reliable ball contacts and tightly controlled shape of the wire loop. Ball pitches as small as between 75 and 40 µm can be achieved. Such advances can, for instance, be found in the computerized bonder 8020 by Kulicke & Soffa, Willow Grove, Pa., U.S.A., or in the ABACUS SA by Texas Instruments, Dallas, Tex., U.S.A. Moving the capillary in a predetermined and computer-controlled manner through the air will create a wire looping of exactly defined shape. For instance, with recent technical advance, rounded, trapezoidal, linear and customized loop paths can be formed. Finally, the capillary reaches its desired destination, for instance terminal pad 302. The capillary is lowered to touch the pad; with an imprint of the capillary, a metallurgical stitch bond is formed, and the wire is flamed off to release the capillary. Stitch contacts are small yet reliable; the lateral dimension of the stitch imprint is about 1.5 to 3 times the wire diameter (its exact shape depends on the shape of the capillary used, such as capillary wall thickness and capillary footprint). Consequently, the area of the terminal pads 302 can be designed small.

It is further important for the present invention that recent technical advances allow the formation of the wire looping with a minimum length of bonding wire by moving the bonding capillary the shortest feasible distance over the first surface 301a of the substrate 301. As a consequence, the looping of wires 401 can cross the substrate 301 at a height of approximately 10 µm and approach the pad surface at a low angle. At the stitch, there is no minimum height for a ball needed, nor is there a heat-affected wire zone, which would be mechanically weak for bending or other deformation stresses. Further, because of this minimum wire looping, high looping spans are no longer an issue.

Together, the progress in wire bonding technology provides makes chip-scale molded packages for micromechanical devices feasible.

Process Flow B. Step 4: Forming Leadframe.

For example and illustration purposes, FIGS. 4B to 9B describe the use of a leadframe for the present invention in only one specific variation. For anyone skilled in the art, however, it will be easy to modify and vary the description in order to adopt and extend the use of leadframes for modified designs and processes. The leadframe for semiconductor devices was invented (U.S. Pat. Nos. 3,716,764 and 4,034,027) to serve several needs of semiconductor devices and their operation simultaneously: First of all, the leadframe provides a stable support pad for firmly positioning the semiconductor chip. Since the leadframe including the pads is made of electrically conductive material, the pad may be biased, when needed, to any electrical potential required by the network involving the semiconductor device, especially the ground potential. This part of the leadframe (chip pad) is not shown in FIGS. 4B to 9B.

Secondly, the leadframe offers a plurality of conductive segments to bring various electrical conductors into close proximity of the chip. The remaining gap between the ("inner") tip of the segments and the conductor pads on the IC surface are typically bridged by thin metallic wires, individually bonded to the IC contact pads and the leadframe segments. For the present invention, the inner leads are modified to be soldered to the chip bonding pads.

Thirdly, the ends of the lead segment remote from the IC chip ("outer" tips) need to be electrically and mechanically connected to "other parts" or the "outside world", for instance to assembly printed circuit boards. In the overwhelming majority of electronic applications, this attachment is performed by soldering. Obviously, the technique of soldering implies that reliable wetting and solder contact can be performed at the (outer) segment tips.

It has been common practice to manufacture single piece leadframes from thin (about 120 to 250 µm) sheets of metal. For reasons of easy manufacturing, the commonly selected starting metals are copper, copper alloys, iron-nickel alloys (for instance the so-called "Alloy 42"), and invar. The desired shape of the leadframe is etched or stamped from the original sheet. In this manner, an individual segment of the leadframe takes the form of a thin metallic strip with its particular geometric shape determined by the design. For most purposes, the length of a typical segment is considerably longer than its width.

In the European patent # 0 335 608 B1, issued 14 Jun. 1995 (Abbott, "Leadframe with Reduced Corrosion"), a palladium-plated leadframe is introduced which is not subject to corrosion due to galvanic potential forces aiding the migration of the base metal ions to the top surface where they will form corrosion products. The patent describes a sequence of layers consisting of nickel (over the base metal), palladium/nickel alloy, nickel, and palladium (outermost).

Nickel/palladium plated leadframes are used for the present invention. The leadframes shown in FIGS. 4B to 9B, therefore, comprise insensitivity to corrosion, good solderability for inner and outer lead attachments, good adhesion to molding compounds, and ductility for forming and bending the segments.

Figure 4B:
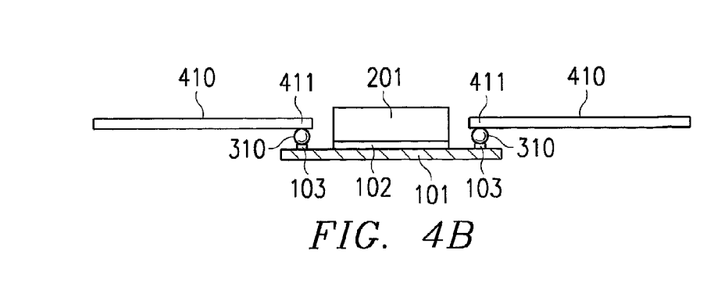

FIG. 4B depicts the leads 410 of a metallic leadframe to be used for contacting solder balls 310 attached to the chip bonding pads 103. When device variations require maximum thermal performance, direct heat dissipation from the silicon chip 101 to the ambient may be the best solution, and the leadframe is used without chip pad, as in the example of FIG. 4B. When a chip pad is employed, however, the chip is first attached to the pad using a polymerizable epoxy or polyimide material, before solder attaching the leadframe.

Process Flow B. Step 5: Solder Attaching Leadframe.

It is well known that copper leadframes plated by a nickel layer, followed by a palladium layer, are easily attached by soldering. In the soldering process, the palladium is dissolved by the solder, which is then wetting the clean underlying nickel uniformly and perfectly. The reflow temperature of the solder can be chosen compatible with the device sensitivities.

As schematically indicated in FIG. 4B, the tips 411 of the inner segments of the leadframe are attached to the chip bonding pads 103 by the solder material ("balls") 310.

Process Flows A and B. Step 6: Molding.

Figure 10A:
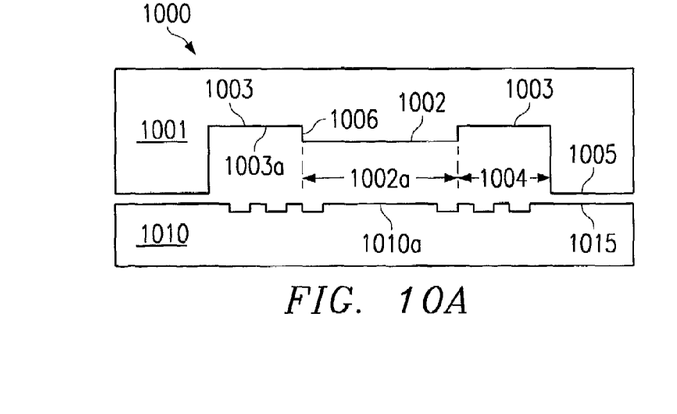
FIG. 10A is a schematic and simplified cross section of the top and bottom halves of the molding apparatus designed according to the invention for transfer molding a micromechanical device having its chip wire-bonded to a substrate.

The micromechanical chip, assembled according to process steps 1 through 5 is placed into a mold to perform the encapsulating transfer molding process step. For Process Flow A, the mold is shown in FIG. 10A, generally designated 1000. The mold comprises the top half 1001 and the bottom half 1010, each having a cavity for holding the respective portions of the assembled device. The design of the molding apparatus is essential for the present invention. Top half 1001 provides a flat portion 1002, located in the center of the top half, mirror-imaging the location of the plurality of micromechanical components. The flat portion 1002 exhibits the general outline of the plurality of the components (one length is designated 1002a in FIG. 10A), yet has an area slightly larger than the area of the plurality of the components. The elevation 1006 of the flat portion 1002 is designed so that flat surface 1002 will uniformly contact the sheet-like protector 201, and will be in a plane parallel to the plane of the components, when the two mold halves are operated into mold-closed position.

Top half 1001 further provides portions 1003, which are designed to define the surfaces of the selective encapsulating body of the device. Those surfaces have to be flat and smooth and, located in a plane parallel to the plane of the micromechanical components, since they are intended to support the attached lid of the completed device. Consequently, portions 1003 have to be formed by modern precision-mechanical techniques (a method frequently employed in mold fabrication) in order to exhibit flat and smooth surfaces 1003a. The encapsulating body has the general shape of a peripheral frame, molded such that it surrounds the centrally located components. The width 1004 of the frame is designed so that it creates molded material selectively encapsulating the chip bonding pads 103, the coupling members 401, and the substrate terminals 302 (see FIG. 3A).

The mold 1000 is further designed so that either the top half 1001 or the bottom half 1010 has a plurality of runners and a plurality of gates for feeding encapsulation material into the cavities (not shown in FIG. 10A).

The molding process starts by positioning the substrate together with the assembled chip (see FIG. 4A) into the boom mold half 1010 (see FIG. 10A) so that the micromechanical components are positioned away from the bottom mold half surface 1010a. Next, the mold is closed by clamping the top half 1001 onto the bottom half 1010 and forming a tight seal at the surfaces 1005 and 1015.

Next, encapsulation material is pressured through the runners and gates into the top and bottom cavities. Flowable encapsulation material is thus deposited on the peripheral areas of the assembled chip; it engulfs and protects the sensitive coupling members 401 and bonding pads 103. Preferably, the encapsulation material is a molding compound comprising epoxy-based thermoset resin, filled with silica and anhydrides. It is especially advantageous to select a material formulated for high adhesion, as long as care is taken to avoid adhesion of the compound to the steel of the mold halves. A wide variety of molding compounds are commercially available from the companies Sumitomo Bakelite, ShinEtsu, Hitachi Chemical, and Nitto Denko, all of Japan, and Cookson Electronic Materials (formerly Plaskon) and Dexter Hysol, both U.S.A.

Figure 5A:
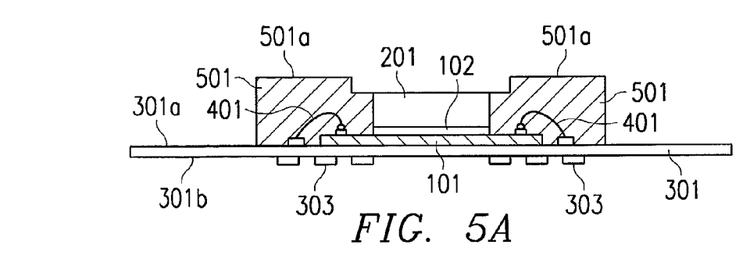

It is common practice to leave the freshly molded device in the mold until the material is at least partially cured. The time required depends on the molding compound selected; it is typically between 30 s and 2 min. In this polymerization process, the molding compound hardens enough to allow opening of the mold. Next, the encapsulated device is removed from the mold. The device has an appearance as indicated in FIG. 5A. It consists of the chip 101, covered by the protector 201 and assembled on the substrate 301, and the molded frame 501 characterized by the flat surfaces 501a in a plane parallel to the plane of the micromechanical components 102. The polymerization of the molding compound is completed by an additional curing cycle lasting from about 30 min to 6 h, depending on the compound selected.

Figure 10B:
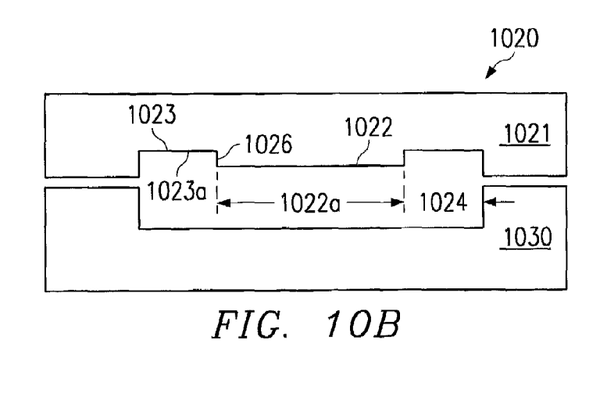
FIG. 10B is a schematic and simplified cross section of the top and bottom halves of the molding apparatus designed according to the invention for transfer molding a micromechanical device having its chip solder-connected to a leadframe.

For Process Flow B, the mold is shown in FIG. 10B, generally designated 1020. The mold comprises the top half 1021 and the bottom half 1030, each having a cavity for holding the respective portions of the assembled device. In contrast to the mold in FIG. 10A, mold 1020 has a relatively deeper cavity in the bottom half 1030 and consequently a relatively shallower cavity in the top half 1021. The shape of the assembled device depicted in FIG. 4B determines the shape and relative depths of the cavities 1021 and 1030. However, top half 1021 again provides a flat portion 1022, located in the center of the top half, mirror-imaging the location of the plurality of micromechanical components. The flat portion 1022 exhibits the general outline of the plurality of the components (one length is designated 1022a), yet has area slightly larger than the area of the plurality of the components. The elevation 1026 of the flat portion 1022 is designed so that flat surface 1022 will uniformly contact the sheet-like protector 201 (see FIG. 4B), and will be in a plane parallel to the plane of the components, when the two mold halves are operated into mold-closed position.

Top half 1021 further provides portions 1023, which are designed to define the surfaces of the selective encapsulating body of the device. They are structured and manufactured similar to portions 1003 in FIG. 10A, especially concerning the flat and smooth surfaces 1023a and the width 1024.

The mold 1020 is further designed so that either the top half 1021 or the bottom half 1030 has a plurality of runners and a plurality of gates for feeding encapsulation material into the cavities (not shown in FIG. 10B).

Figure 5B:
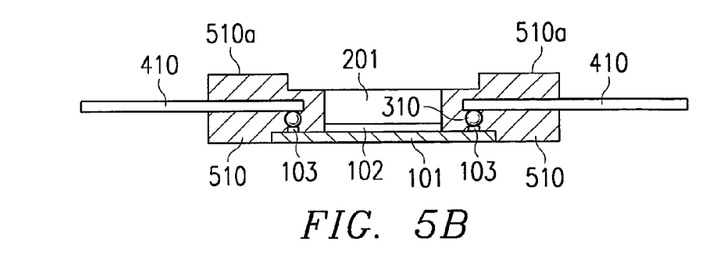

The molding and curing processes are analogous to the ones in Process Flow A described above. After removing the encapsulated device from the mold, it has an appearance as indicated in FIG. 5B. It consists of the chip 101, covered by the protector 201 and assembled on the leadframe 410, and the molded frame 510 characterized by the flat surfaces 510a in a plane parallel to the plane of the micromechanical components 102. The space above components 102 is left empty.

Process Flows A and B. Step 7: Removing Protector.

Figure 6A:
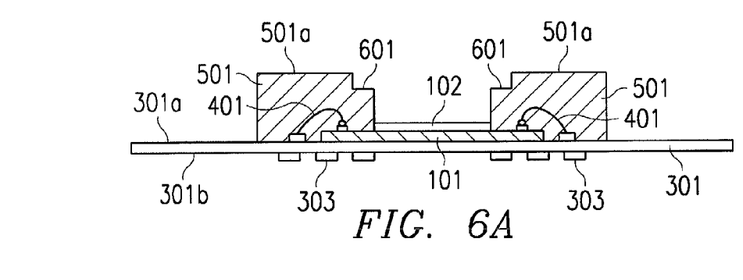
Figure 6B:
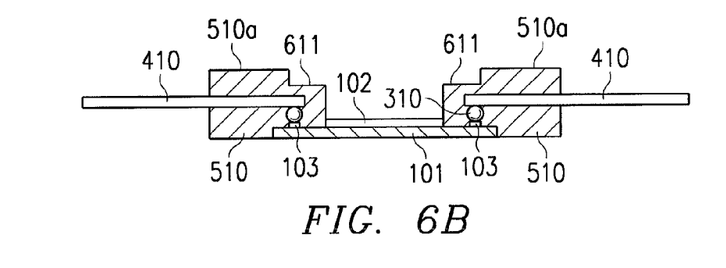

As FIGS. 6A and 6B indicate, the sheet-like polymer material protecting the surfaces of the plurality of micromechanical components 102 is removed so that the surfaces of the components are exposed. If the polymer material was selected from the water-soluble group listed under Process Flow Step 2, the preferred method of removal is dissolving the material in water.

Process Flows A and B. Step 8: Activating Components.

In the preferred method, the next process step is the activation of the micromechanical components and cleaning of the molded package. In the case of micromirror devices, this step consists of removing the photoresist under the mirrors and activating the components using plasma etch or a combination of a plasma etch/UV cure process to remove any contaminates from the surfaces of the molded frame 501 and 510, respectively, and the surfaces of the components 102.

Process Flows A and B. Step 9: Inserting Passivant.

Figure 7A:
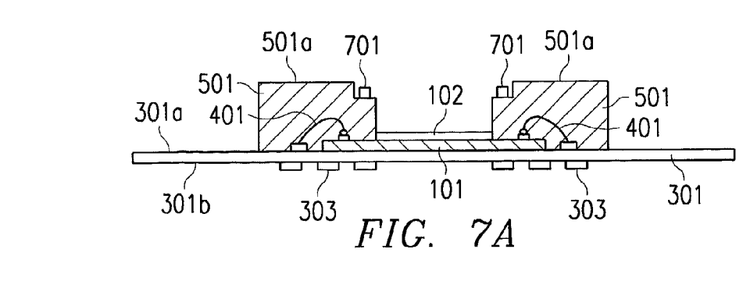
Figure 7B:
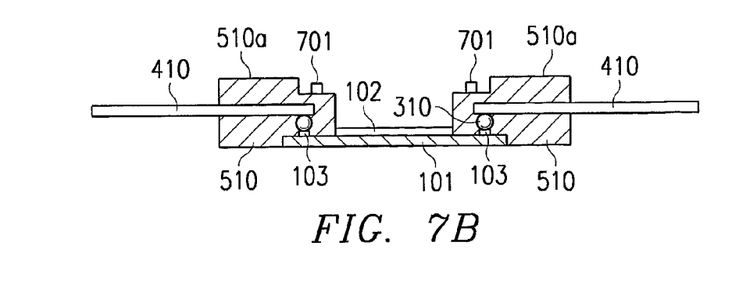

Molds as illustrated in FIGS. 10A and 10B are capable of creating ridge-like molded protrusions, such as indicated by 601 in FIG. 6A, and 611 in FIG. 6B. These protrusions are located between the molded frame surfaces 501a and 510a, respectively, and the micromechanical components 102. They serve the purpose of storing chemical compounds intended to remain inside the package volume after closure by the covering lid. These chemicals are typically supplied as pills or granular material. In FIGS. 7A and 7B, they are generally designated 701.

For micromirror devices, such chemicals are suitable for releasing passivants continuously for the lifetime of the device in order to coat all contacting surfaces of the micromechanical devices. More detail about composition, operation and method of metered deposition can be found in the above-quoted U.S. Pat. Nos. 5,939,785 and 5,936,758.

Process Flows A and B. Step 10: Attaching Lid.

Figure 8A:
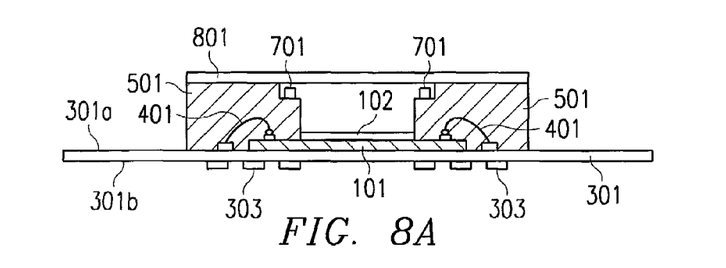
Figure 8B:
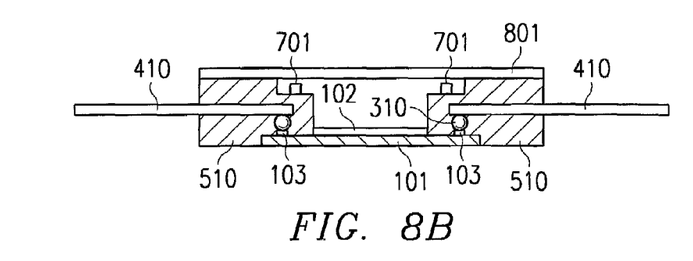

Right after the deposition of any chemical compound 701, a lid 801 is attached to close the package, as shown in FIGS. 8A and 8B. Typically, lids 801 have to be cleaned from impurities and dehydrated by baking in reduced-pressure environment before attachment. Afterwards, they are attached to the smooth, flat surfaces of the molded frame, preferably using an epoxy adhesive. Temperature and time needed to polymerize the adhesive also serve to sublimate an amount of the passivant 701 within the package so that the active surfaces of the micromechanical components are coated with at least a monolayer of the passivant.

For micromirror devices, lid 801 is a plate made of glass or any other material transparent to light in the visible range of the electromagnetic spectrum. Requirements for optical flatness of the plate are described in quoted U.S. Pat. No. 5,939,785. Care has to be taken that attached lid 801 is in a plane parallel to the plane of the plurality of micromirrors 102.

Process Flows A and B. Step 11: Marking.

The enclosed micromechanical devices are marked with identification such as device type and number, fabrication information, country of origin, etc.

Process Flow A. Step 12: Trimming/Singulation.

Figure 9A:
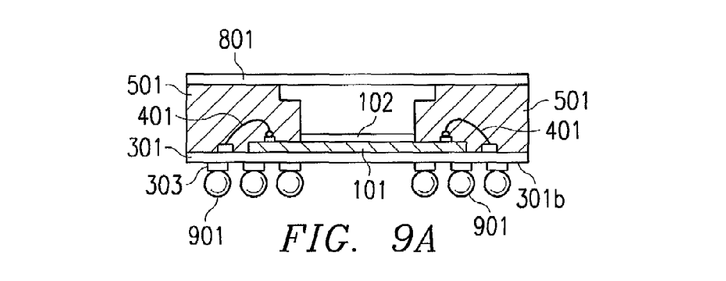

As indicated in FIG. 9A, substrate 301 is trimmed to match the size of the package. In the preferred embodiments, this is a chip-scale package. Exhibiting a plurality of terminals 303 (typically copper, often with a gold-flash surface) on the second surface 301b of substrate 301, the micromechanical device package is of the "land grid array" type.

Process Flow B. Step 12: Trimming/Forming.

Figure 9B:
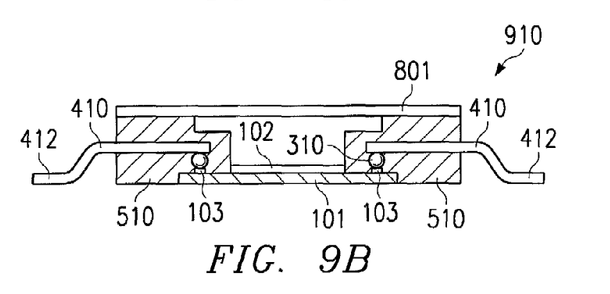

As indicated in FIG. 9B, the outer segments 412 of leadframe 410 are trimmed and formed suitable for surface mount attachment to circuit or mother boards. Since surface mounting is commonly performed by solder reflow, formed segments 412 may have a nickel-and-palladium plated surface (see Process Flow B, Step 4), or a solder plated surface, as described in U.S. Patent Application No. 60/138,070, dated Jun. 8, 1999. The example of lead forming illustrated in FIG. 9B is of the "gull wing" type, typically used for "small outline" semiconductor devices. The finished molded micromechanical device, generally designated 910 in FIG. 9B, is therefore a "leaded small outline" device.

Process Flow A. Step 13: Attaching Solder Balls Solder "balls" 901 may be attached to the substrate terminals 303 in FIG. 9A. The solder balls may be a conventional lead/tin alloy, or a lead-free mixture as described above. The diameter can vary widely; typical sizes range from 0.5 to 1.5 mm. With solder balls attached, the finished molded "land grid array" package is transformed into a type of "ball grid array" package, as used widely in modern electronic applications.

After electrical testing the leaded small outline device and the land grid array/ball grid array device, the finished molded micromechanical device is ready for packing and shipping.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. As an example, the material of the semiconductor chip may comprise silicon, silicon germanium, gallium arsenide, or any other semiconductor material used in manufacturing. As another example, the heights consumed for chip assembly and package molding can be minimized in order to reduce the thickness of the device. The invention can be applied to the manufacture of "thin" small outline packages and "thin" land grid/ball grid array packages.

As another example, important for several device applications, the first embodiment (featuring bonding wires) can be combined with the fourth embodiment (featuring leadframes). This combination creates a low-cost micromechanical device package characterized by the mature technologies of wire bonding and surface mounting. As another example, the invention can be extended to batch processing, further reducing packaging costs. It is therefore intended that the appended claims encompass any such modifications or embodiments.

We claim:

1. A device comprising:
   a. a substrate having a top surface, a bottom surface, and a edge surface;
   b. a chip, having micro-mechanical components incorporated in a top surface, coupled to the top surface of the substrate; the top surface of the chip substantially parallel to the top surface of the substrate;
   c. a plastic mold member, having a substantially flat top surface, a substantially flat bottom surface, a substantially straight outer surface, and a substantially straight inner surface forming a hollow center portion, encapsulating a portion of the top surface and the entire edge surface of the substrate; the bottom surface of the plastic mold member and the bottom surface of the substrate being substantially co-planar; a notch near the intersection of the top surface and the inner surface of the plastic mold member adapted to receive a chemical substance suitable for releasing passivants to coat the mechanical components;
   d. the top surface of the plastic mold member adaptable to receive a cover lid member; and
   e. a gap of predetermined width between the micromechanical components in the top surface of the chip and the cover lid member free of solid material.

2. The device of claim 1, in which the mechanical components are light reflecting mirror members.

3. The device of claim 1, in which the cover lid member is transparent to light.

4. The device of claim 1, in which the substrate is a leadframe with a die-attach pad.

5. The device of claim 1, in which the substrate is selected from a group consisting of flexible films made of polymers, polyimides or epoxies; and
   sheet-like boards made of FR-4, FR-5, BT resin; and glass-fiber strengthened dielectrics.

6. The device of claim 1, further comprising an integrated circuit between the micromechanical components and the substrate.

7. The device of claim 2, in which also encapsulated by the plastic mold member are electrically conductive coupling members coupling the integrated circuit chip to the substrate.

8. The device of claim 1, further comprising conductive solder balls for communicating between the chip and outside the device.

9. The device of claim 1, further comprising conductive leads for communicating between the chip and outside the device.

* * * * *